(12) United States Patent
Bollin

(10) Patent No.: US 7,889,089 B1
(45) Date of Patent: *Feb. 15, 2011

(54) AUXILIARY GENERATOR SELF-TEST VERIFICATION DEVICE

(76) Inventor: Daniel L. Bollin, 8720 Birch Bark Dr., Sylvania, OH (US) 43560

( * ) Notice: Subject to any disclaimer, the term of this patent is extended or adjusted under 35 U.S.C. 154(b) by 608 days.

This patent is subject to a terminal disclaimer.

(21) Appl. No.: 11/904,907

(22) Filed: Sep. 28, 2007

Related U.S. Application Data

(63) Continuation-in-part of application No. 11/190,733, filed on Jul. 27, 2005, now Pat. No. 7,436,287.

(60) Provisional application No. 60/598,643, filed on Aug. 4, 2004.

(51) Int. Cl.
*G08B 21/00* (2006.01)

(52) U.S. Cl. .................. 340/635; 340/309.16; 340/679; 320/134

(58) Field of Classification Search ................ 340/635, 340/309.16, 679; 320/134; 324/149
See application file for complete search history.

(56) References Cited

U.S. PATENT DOCUMENTS

| | | | |
|---|---|---|---|
| 4,323,820 A | 4/1982 | Teich | |
| 4,471,233 A | 9/1984 | Roberts | |
| 4,686,379 A | 8/1987 | Ohnari | |
| 4,703,191 A | 10/1987 | Ferguson | |
| 4,751,629 A | 6/1988 | Shimizu et al. | |
| 5,191,229 A | 3/1993 | Davis et al. | |
| 5,264,732 A | 11/1993 | Fiorina et al. | |
| 5,268,850 A | 12/1993 | Skoglund | |
| 5,903,065 A | 5/1999 | Dragos | |
| 5,984,719 A | 11/1999 | Flegel | |
| 6,107,692 A | 8/2000 | Egri et al. | |
| 6,420,801 B1 | 7/2002 | Seefeldt | |
| 6,593,670 B2 | 7/2003 | Anderson | |
| 6,657,416 B2 | 12/2003 | Kern et al. | |
| 6,707,169 B2 | 3/2004 | Shimizu et al. | |
| 6,720,872 B1 * | 4/2004 | Engel et al. ................. 340/514 |
| 7,436,287 B1 * | 10/2008 | Bollin ................... 340/309.16 |

\* cited by examiner

*Primary Examiner*—Davetta W Goins
(74) *Attorney, Agent, or Firm*—MacMillan, Sobanski & Todd, LLC

(57) ABSTRACT

A device for monitoring the self-testing of an auxiliary generator provides an alarm signal if the generator does not start and operate within a predetermined time period.

19 Claims, 10 Drawing Sheets

AUXILIARY GENERATOR SELF-TEST VERIFICATION DEVICE

CROSS-REFERENCE TO RELATED APPLICATIONS

This application is a continuation-in-part of U.S. patent application Ser. No. 11/190,733, filed Jul. 27, 2005 and claims the benefit of U.S. Provisional Application No. 60/598,643, filed Aug. 4, 2004, now U.S. Pat. No. 7,436,287 B1, the disclosure of which is incorporated herein by reference.

BACKGROUND OF THE INVENTION

This invention relates in general to auxiliary electrical generators having a self-testing capability and in particular to a device for automatically verifying satisfactory operation of the self-testing capability of auxiliary electrical generators.

Increasing concern over the reliability of commercial electric utility companies has resulted in the installation of auxiliary electrical generating units in many residences and small commercial establishments. Such generators typically include a prime mover coupled to a small electric generator. The prime mover is selected to utilize an available fuel, such as, for example, gasoline, diesel fuel, propane or natural gas. A control unit detects failure of the commercial source of electric power and is operable to isolate the electrical circuit of the residence or commercial establishment from the commercial electric power grid. The control unit then starts the prime mover and connects the generator output to supply electrical power to the electrical circuit of the residence or commercial establishment. The control unit also detects the return to service of the commercial electric power grid and is operative to disconnect the generator, reconnect the residence or commercial establishment to the commercial grid and shut down the generator prime mover.

Auxiliary electric generators are available in various sizes so that the particular unit may be matched to the anticipated electrical load. To assure that the auxiliary electric generators will respond to a power outage, the generator control units typically include a self-test feature that periodically starts the prime mover and verifies that the generator is operable to supply electric energy. The period between tests is preset by the auxiliary generator manufacturer or user and may range from weekly to monthly. However, auxiliary generators generally lack a means to verify that the self-test has been successfully completed other than observing the operation of the unit. Accordingly, it would be desirable to provide a device to verify that the generator self-test has been successfully completed.

BRIEF SUMMARY OF THE INVENTION

This invention relates to a device for verifying satisfactory operation of the self-testing capability of auxiliary electrical generators.

The present invention contemplates a device for verifying the self-testing function of an auxiliary electric generator that includes a microprocessor adapted to be connected to an output of the auxiliary generator and that is operative to monitor the duration of time that has passed since the auxiliary generator has produced an output voltage. The device also includes a plurality of switches connected to the microprocessor; the switches being operable to set operating parameters related to the auxiliary generator within the microprocessor. The device further includes a display screen connected to said microprocessor that is operative to display status indicators related to the auxiliary generator and an alarm device connected to the microprocessor. The microprocessor is operative to activate the alarm device upon a predetermined period passing without detection of an output voltage being generated by the auxiliary generator.

The present invention also contemplates a method for verifying the self-testing function of an auxiliary electric generator that includes the steps of providing the device described above. The method also includes monitoring the generator output and actuating the alarm device upon a predetermined period passing without the generator being started for a self-test. The method further includes resetting the timer upon detection of energization of the auxiliary generator output.

Various objects and advantages of this invention will become apparent to those skilled in the art from the following detailed description of the preferred embodiment, when read in light of the accompanying drawings.

DETAILED DESCRIPTION OF THE PREFERRED EMBODIMENT

Figure 1:
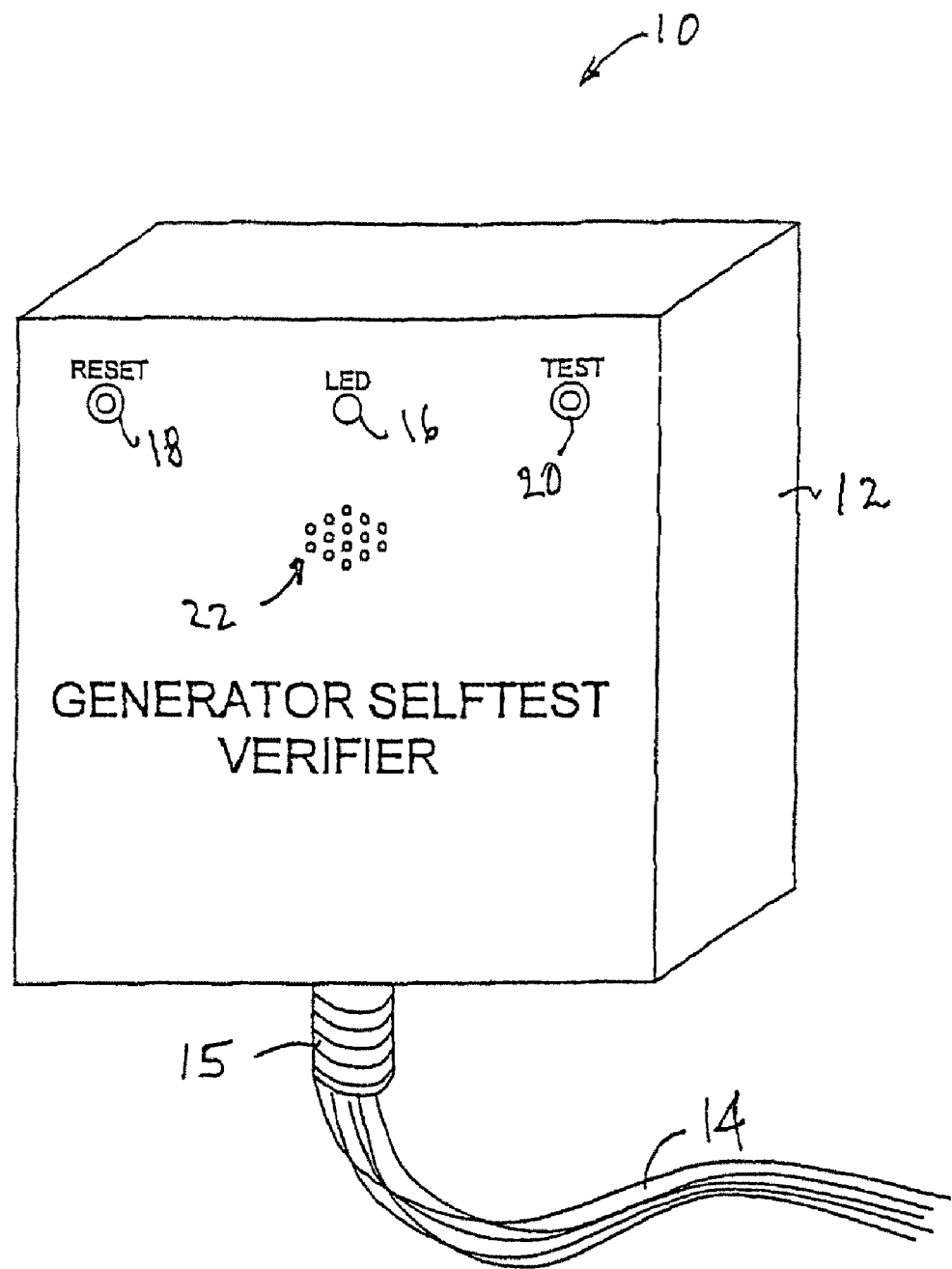
FIG. 1 is a perspective view of an auxiliary electric generator self-test verification device in accordance with the invention.

Referring now to the drawings, there is illustrated in FIG. 1 an auxiliary electric generator self-test verification device 10 that is in accordance with the invention. The device is contained in a small housing 12 and connected to the auxiliary generator by multi-conductor cable 14. In the preferred embodiment, the housing 12 is formed from plastic; however, other materials, such as, for example, steel and aluminum, also may be utilized to form the housing 12. The cable 14 allows mounting of the device 10 adjacent to the auxiliary generator. The housing 12 is fitted with a threaded assembly 15 to allow the device to be mounted to a standard 0.5" knockout. The cable wires protrude through the bottom of the threaded assembly 15 and are color coded for easy identification. An activity LED 16 is mounted upon the front surface of the housing 12 with RESET and TEST pushbuttons 18 and 20, respectively. Also, a plurality of small apertures 22 are formed through the front housing surface to allow transmission of an audible alarm through the housing 12.

Figure 2:
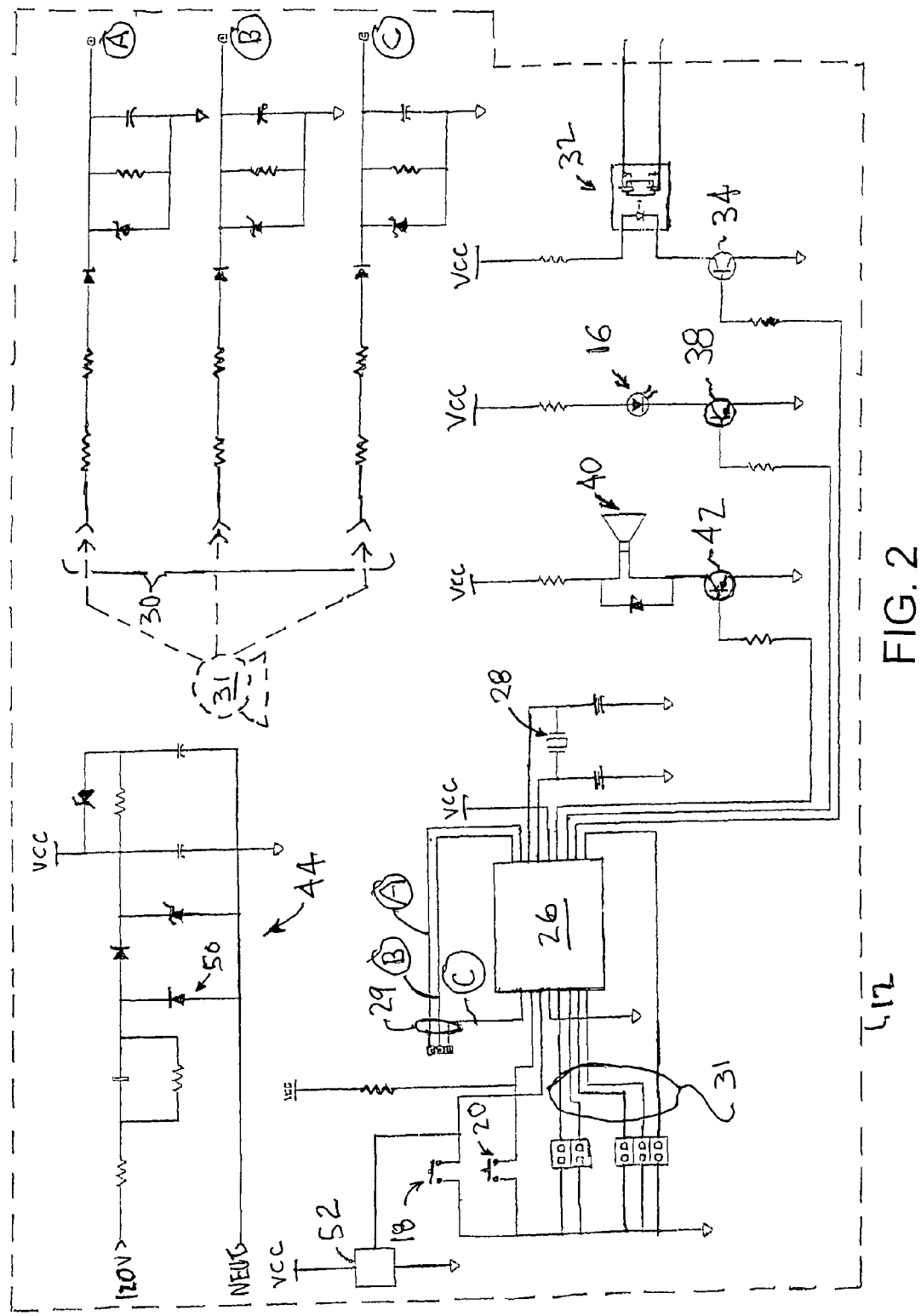
FIG. 2 is a circuit diagram for the device shown in FIG. 1.

A schematic circuit diagram of the device 10 is shown in FIG. 2. The circuit includes a microprocessor 26 that controls the operation of the device 10 and includes a timer function. The time base for the timer function is provided by an inexpensive crystal 28. The microprocessor 26 contains an on-chip 8-bit analog-to-digital converter that is used to measure the amplitude of the input voltages. The expected accuracy of the voltage measurement circuitry is 10%.

The microprocessor 26 also is operative to monitor the operation of the associated auxiliary generator. Three generator voltage input pins 29 on the microprocessor 26 receive input signals from three input circuits 30 that are labeled "A", "B" and "C" in FIG. 2. Each of the input circuits 30 includes a filter and a voltage regulating Zener diode and are connected to the electrical outputs of an auxiliary generator 31. The input circuits 30 are operative to make the corresponding generator voltage input pin 29 on the microprocessor 26 go to a corresponding analog voltage level when the generator is started.

Several other I/O pins of the microprocessor 26 are configured as inputs with one input pin connected through the RESET pushbutton 18 to ground and a second input pin connected through the TEST pushbutton 20 to ground. Thus, depressing either the RESET or TEST pushbutton 18 or 20 will pull the corresponding microprocessor input pin to ground. Five other input pins are configured as jumper inputs 31, for setting the device timing cycle and device calibration for the generator output, as described below. Three I/O pins are configured as outputs, one to drive the activity LED 16, one to drive an alarm relay 32, and one to drive an audible alarm 40.

other devices, such as micro-switches, also may be used to select the timeout duration. The time out intervals shown in the above table are intended to be exemplary, and the invention contemplates that other timeout intervals than those shown in the table may be used.

Figure 3:
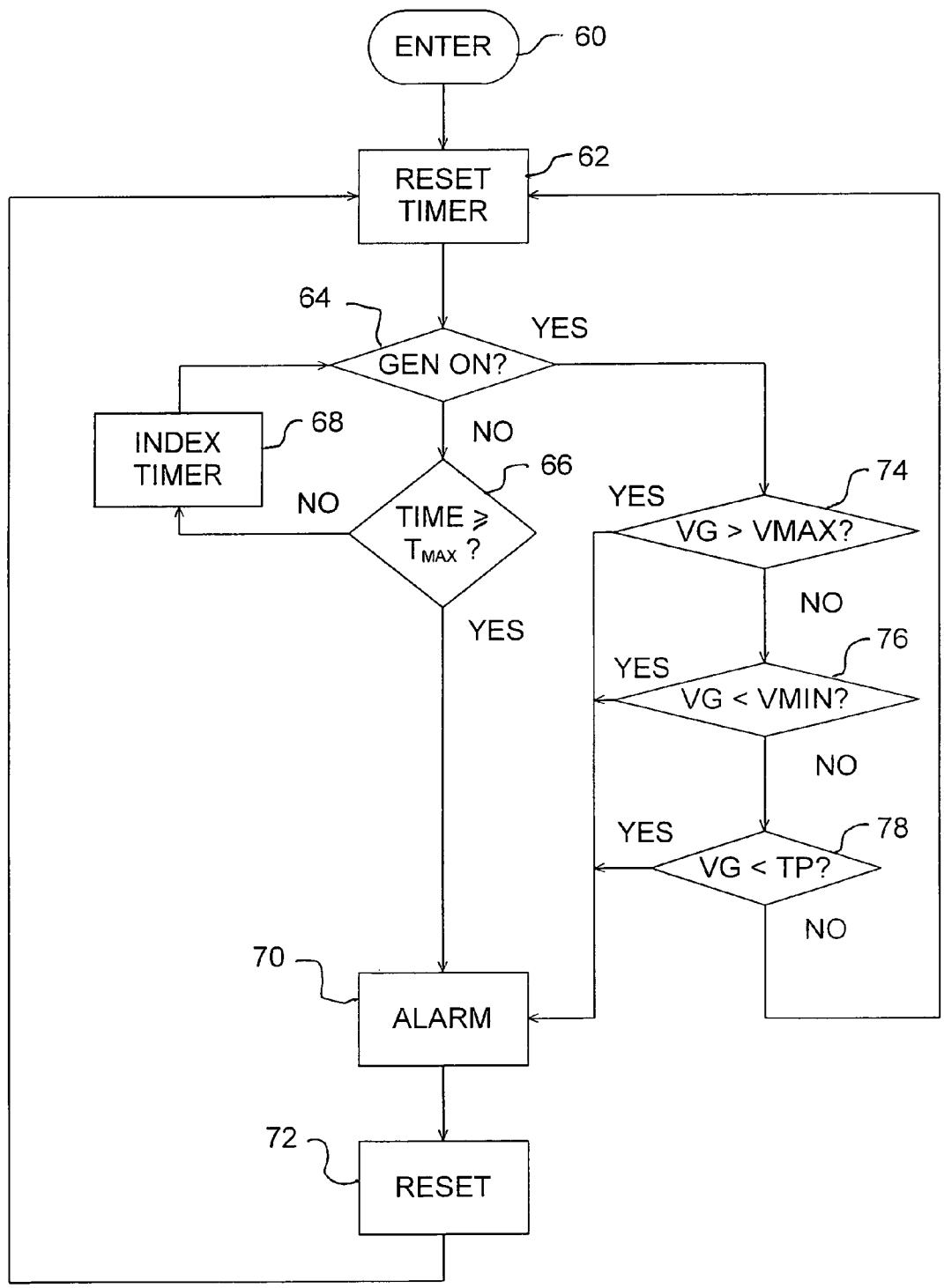
FIG. 3 is a flow chart illustrating the operation of the device shown in FIG. 1.

The lower three jumper inputs shown in FIG. 3 that are labeled JMP3, JMP4 and JMP5 allow the device 10 to be configured for different reset signals received upon the inputs to the device from the auxiliary generator output. The voltage select jumpers allow for connection to either a single or a three phase generator. In the preferred embodiment, the device 10 will be reset when all of the selected "hot" auxiliary generator leads are present for a time period of 2 minutes or more; however, other time periods for resetting the device 10 periods may be selected. In addition to detecting the presence of the "hot" lead, the circuitry will also determine if the voltage falls within a pre-determined voltage window. This allows for detection of over-voltage and under-voltage generator output conditions. The accuracy of the detection circuitry is estimated to be 10% of full scale. The possible combinations for the lower three jumper inputs are shown in the following table:

| Jmp 3 | Jmp 2 | Jmp 1 | Typical Generator Output | Allowable Generator Voltage Output (ø-NEUT) | Connections (NEUT of 120 serves as reference) |
|---|---|---|---|---|---|
| Out | Out | Out | 1ø 120/240 | 90 to 130 | 2 hot leads to Input A,B |
| Out | Out | In | 3øY 120/208 | 90 to 130 | 3 hot leads to Inputs A,B,C |
| Out | In | Out | 3øY 277/480 | 231 to 300 | 3 hot leads to Inputs A,B,C |
| Out | In | In | 3øY 220/380 | 185 to 243 | 3 hot leads to Inputs A,B,C |
| In | Out | Out | 3øΔ 240 | 200 to 260 | 2 hot leads to Inputs A,B (see Note 1) |
| In | Out | In | 3øΔ 480 | 400 to 520 | 2 hot leads to Inputs A,B (see Note 1) |
| In | In | Out | <<reserved>> | <<reserved>> | <<reserved>> |
| In | In | In | <<reserved>> | <<reserved>> | <<reserved>> |

In the preferred embodiment, the upper two jumper inputs shown in FIG. 2 that are labeled JMP1 and JMP2 provide four possible timer cycles, or timeout intervals, as shown in the following table:

| Jumper 1 | Jumper 2 | Timeout |
|---|---|---|
| Out | Out | 8 days |
| Out | In | 15 days |
| In | Out | 22 days |
| In | In | 32 days |

The invention contemplates that the microprocessor 26 triggers an alarm if the timeout expires without the auxiliary generator being started and producing electricity during the selected timeout interval. The timeout interval is selected to match the self-test period for the auxiliary generator plus one day. Thus, for example, if the auxiliary generator is programmed to be test started every seven days, the eight day timeout interval would be selected. Then, if eight days pass without the auxiliary generator being started and producing electricity, the microprocessor 26 is operable to trigger the alarm.

The microprocessor 26 is further operable to reset the timeout interval when production of electricity by the auxiliary generator for a predetermined time period is detected. While jumpers are described above, it will be appreciated that If the auxiliary generator is configured as a 3Ø Δ voltage supply, one lead of the Δ secondary must be connected to earth ground. While jumpers are described above, it will be appreciated that other devices, such as micro-switches, also may be used to select the timeout duration.

An alarm relay 32 provides a connection from the device 10 to an external alarm reporting device (not shown). In the preferred embodiment, the alarm relay 32 is a semiconductor relay; however, the invention also may be practiced with a conventional mechanical relay (not shown). The selection of a semiconductor relay assures low power consumption and the "contacts" of a typical semiconductor relay are typically limited to 100 mA maximum. While such a rating is fine for low voltage alarm triggering, an external relay would be provided if a large external load is desired. In the preferred embodiment, the relay 32 is connected to digital dialer (not shown) that would automatically notify a remote location, such as, for example, a central station, an emergency response facility or a generator maintenance facility, should the generator fail to perform the self-test within the predetermined time interval.

As shown in FIG. 2, the alarm relay 32 is connected between a voltage supply $V_{cc}$ and one end of an electronic switch 34. The other end of the switch 34 is connected to ground so that when the switch is in a conducting state, an activation current flows through the relay. The switch 34 has a control terminal connected to a relay output pin on the microprocessor 26 that supplies a control signal to the switch 34. While a bipolar transistor having a base connected to the microprocessor output pin is shown in FIG. 2, it will be appreciated that other electronic devices also may be used, such as for example, a Field Effect Transistor (FET) having a gate terminal connected to the microprocessor output pin.

As described above, the device also includes a LED 16. The LED 16 provides an indication to the installer/user that the device 10 is operating properly. In the preferred embodiment, the LED 16 will briefly blink once every two seconds as an activity indicator. Also, in the preferred embodiment, following a self-test failure, or detection of an over or under generator output voltage, the LED 16 will blink at a faster rate to alert the user of the self-test failure condition. While the preferred embodiment utilizes a two second blink rate for the LED 16 to indicate proper operation, it will be appreciated that other rates may be used.

Similar to the relay 32, the LED 16 also is connected between a voltage supply $V_{cc}$ and one end of an electronic switch 38. The other end of the switch 38 is connected to ground so that, when the switch is a conducting state, an activation current flows through the LED 16 causing illumination of the diode. The switch 38 has a control terminal connected to a LED output pin on the microprocessor 26 that supplies a control signal to the switch 38. Thus, the LED blink rate is controlled by the microprocessor 26. While a bipolar transistor having a base connected to the microprocessor output pin is shown in FIG. 2, it will be appreciated that other electronic devices also may be used, such as for example, a Field Effect Transistor (FET) having a gate terminal connected to the microprocessor output pin.

The device 10 also has an audible alarm having an audible annunciator 40 that sounds during an alarm condition. The annunciator 40 is connected between a voltage supply $V_{cc}$ and one end of an electronic switch 42. The other end of the switch 42 is connected to ground so that when the switch is a conducting state, an activation current flows through the annunciator 40 causing a audio signal to be emitted. The switch 42 has a control terminal connected to an alarm output pin on the microprocessor 26 that supplies a control signal to the switch 42. In the preferred embodiment, the microprocessor 26 supplies a square wave (approximately 2 kHz) to the switch 42 that causes the annunciator 40 to generate the beeper tone. In the preferred embodiment, the alarm tone will not be on continuously but rather will beep at a 1 second rate (½ second on, ½ second off). An intermittent tone is deemed more noticeable than a tone that is continuously on. Also in the preferred embodiment, the audible alarm is loud enough to be heard while the user is in the same room as the transfer switch, but not loud enough to be heard in another room. Alternately, a louder beeper could be supplied or a remote alarm device that is located in another part of the residence or commercial establishment could be connected to the device 10 (not shown).

The circuit further includes a regulated power supply 44 having a large capacity backup capacitor 46 that is shown in the upper left corner of FIG. 2. The capacitor 46 is connected in parallel with a voltage regulating Zener diode 48. A pair of diodes 50 rectify the alternating input voltage. To minimize cost, the preferred embodiment employs a "transformerless" design which reduces a 120 volt supply to about five volts DC, labeled $V_{cc}$ in FIG. 2, without use of a transformer. However, the invention also may be practiced with a step down transformer (not shown) included in the power supply 44. The power supply backup capacitor 46 supplies power to the generator self-test verification device 10 during the brief time between a true power failure and the generator starting up. The backup capacitor 46 also ensures that the timeout interval is not reset during a brief utility power outage or brownout condition. In the preferred embodiment, the backup capacitor 46 supplies power to the generator self-test verification device 10 for about 30 seconds, which is enough time for the generator to start during either a true power outage or a self-test auto-start condition. As also shown in FIG. 2, a conventional voltage regulator 52 is included in the device 10 between the power supply 44 and the microprocessor 26.

The method of operation of the generator self-test verification device 10 will now be described in light of the flow chart shown in FIG. 3. The flow chart is entered through block 60 whenever 120V AC power is first applied from either the utility or the auxiliary generator, or the RESET pushbutton 18 is pressed. The method proceeds to functional block 62 where the microprocessor 26 will reset the timer and actuate the audible annunciator 34 to sound a quick double-beep. The double beep informs the user that the device 10 has been reset and that the timer has been reset to zero.

The method then continues to decision block 64 where the microprocessor determines whether or not the auxiliary generator has been actuated. If the generator has not been actuated due to either a true power outage or a periodic self-test, the method will transfer to decision block 66 where the total elapsed time since the last device reset is compared to the maximum allowable time $T_{MAX}$ according to the settings of the timer cycle jumpers, JMP1 and JMP2. If the maximum allowable time $T_{MAX}$ has not been exceeded, the method transfers to functional block 68 where the timer is indexed. The method then returns to decision block 64 to again check whether or not the auxiliary generator has been actuated.

If, in decision block 66, it is determined that the maximum allowable time $T_{MAX}$ has been reached or exceeded without the auxiliary generator being actuated, the method transfers to functional block 70 where the audio alarm is sounded. As described above, the device 10 is also operable to notify a remote location of the failure by closing the relay 32 and to increase the flashing frequency of the LED 16. The alarm will continue until the reset pushbutton 18 is pressed in functional block 72, at which time the method returns to functional block 62 where the microprocessor 26 again resets the timer. Pressing the reset pushbutton 18 in functional block 72 also silences the audible alarm and opens the relay contacts.

If, in decision block 64, the microprocessor determines that the auxiliary generator has been actuated, the method transfers to decision block 74 to begin to determine whether or not valid generator start conditions have been met. In the preferred embodiment, a valid generator start condition is defined as the voltage input pins 29 detecting voltages within the prescribed voltage windows shown in the second table above, as specified by the voltage select jumpers, JMP3, JMP4 and JMP5, for a duration longer than two minutes. Therefore, in decision block 74, the voltage upon the input pins 29 is compared to a maximum voltage, $V_{MAX}$. For a single phase auxiliary generator, if the input pin voltage exceeds the maximum voltage $V_{MAX}$, one of the valid start conditions has not been met and the method transfers to functional block 70 where the alarm is sounded. If the input pin voltage is equal to or less than the maximum voltage $V_{MAX}$, the method transfers to decision block 76. For a multiphase auxiliary generator, if any of the input pin voltages exceed the maximum voltage $V_{MAX}$, one of the valid start conditions has not been met and the method transfers to functional block 70 where the alarm is sounded. If all of the input pin voltage are equal to or less than the maximum voltage $V_{MAX}$, the method transfers to decision block 76.

In decision block 76, the voltage upon the input pins 29 is compared to a minimum voltage, $V_{MIN}$. For a single phase auxiliary generator, if the input pin voltage is less than the minimum voltage $V_{MIN}$, another of the valid start conditions has not been met and the method transfers to functional block 70 where the alarm is sounded. If the input pin voltage is equal to or greater than the minimum voltage $V_{MIN}$, the method transfers to decision block 78. For a multi-phase auxiliary generator, if any of the input pin voltages are less than the minimum voltage $V_{MIN}$, another of the valid start conditions has not been met and the method transfers to functional block 70 where the alarm is sounded. If all of the input pin voltages are equal to or greater than the minimum voltage $V_{MIN}$, the method transfers to decision block 78.

In decision block 78, the method checks whether the duration of auxiliary generator operation during the self-test exceeds a predetermined time period, $T_P$, which, as described above, is two minutes in the preferred embodiment. If the generator operation time is less than the predetermined time period $T_P$, the third valid start condition has not been met and the method transfers to functional block 70 where the alarm is sounded. If the generator operation time is equal to or greater than the predetermined time period, $T_P$, the method transfers to functional block 62 where the microprocessor 26 again resets the timer. Thus, during operation of the auxiliary generator, the timer is continuously reset every two minutes and is ready to begin a new timeout cycle when the auxiliary generator is shut down. If the generator voltage input pins 29 do not go to the predetermined voltage level within the timeout period, the audible alarm 34 is activated and the relay 32 closes.

It will be understood that the flow chart shown in FIG. 3 is exemplary, and the invention also contemplates practicing method other than illustrated in FIG. 3. Furthermore, while not shown in FIG. 3, the method also includes activation of the audio alarm 34 and closure of the contacts of the relay 32 when the TEST pushbutton 20 is depressed. Additionally, the LED 16 will flash at its more rapid alarm frequency. This allows the user/installer to easily test the alarm relay 32 output connections. The test condition is removed by depressing the RESET pushbutton 18.

Figure 4:
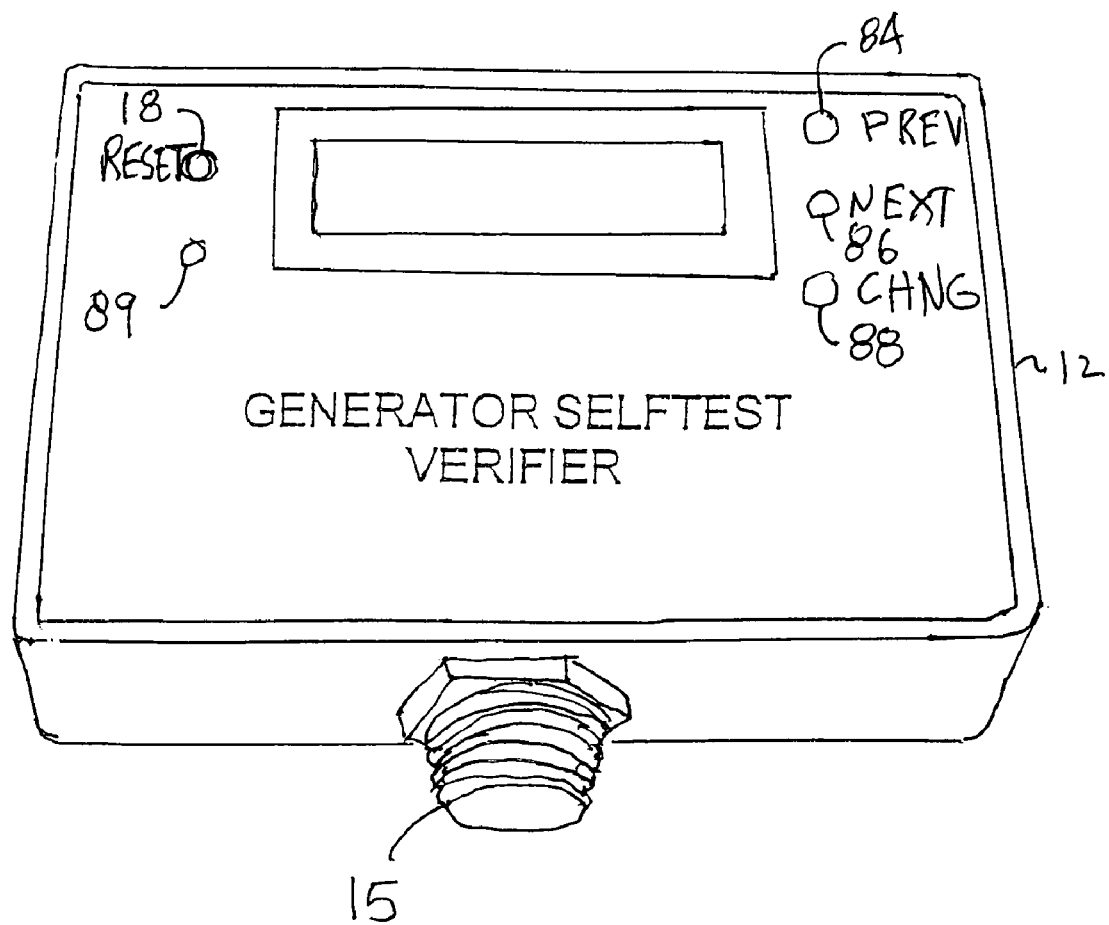
FIG. 4 is a perspective view of an alternate embodiment of the auxiliary electric generator self-test verification device shown in FIG. 1.

An alternate embodiment of the invention is shown generally at 80 in FIG. 4 where components that are similar to components shown in FIG. 1 have the same numerical identifiers. The device 80 again includes a small housing 12 that carries a threaded assembly 15 to allow the device to be mounted to a standard 0.5" knockout. The housing also carries a Liquid Crystal Display (LCD) screen 82 that provides visual identification of the device settings and operation. The LCD screen 82 also is utilized to enter all setup parameters. While a two line, 16 character LCD screen is illustrated, it will be appreciated that the invention also may be practiced with different screen sizes. Similarly, other display screens than an LCD screen may be utilized. As will be described below, the LCD screen 82 is connected to a microprocessor and co-operates with same to display a sequenced series of messages. A plurality of pushbuttons, that includes a reset pushbutton 18 are mounted upon the housing 12. In addition to the reset pushbutton 18, the pushbuttons include a "Previous" pushbutton 84 for indexing the display on the LCD screen 82 to the previously displayed message and a "Next" pushbutton 86 for indexing the display to the next message. A "Change" pushbutton 88 is also included for modifying parameters that are included in the displayed message. An aperture 89 is formed through the housing 12 to allow transmission of an audio alarm through the housing.

Figure 5A:
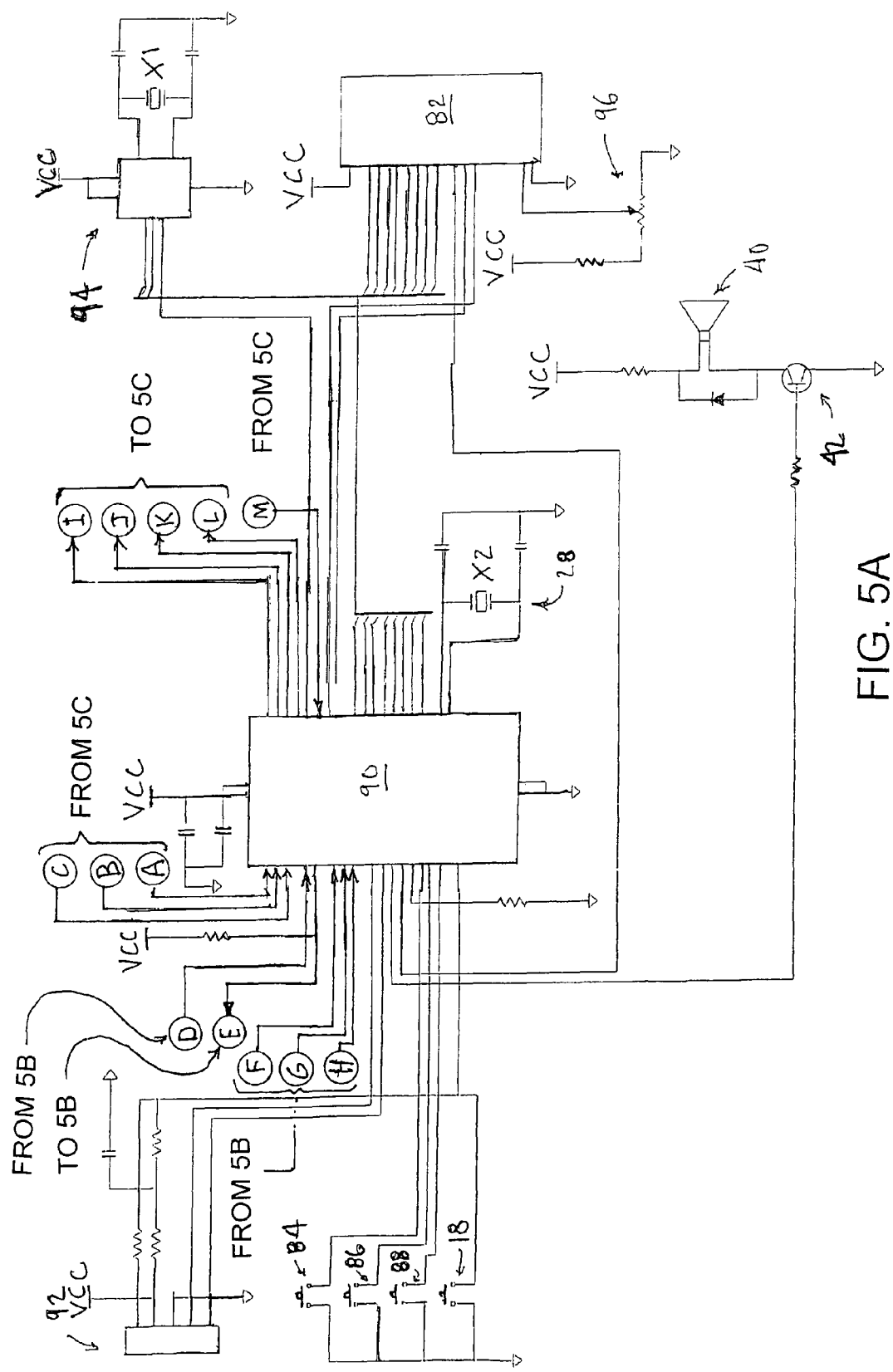
FIGS. 5A through 5C show a circuit diagram for the device shown in FIG. 4.
Figure 5B:
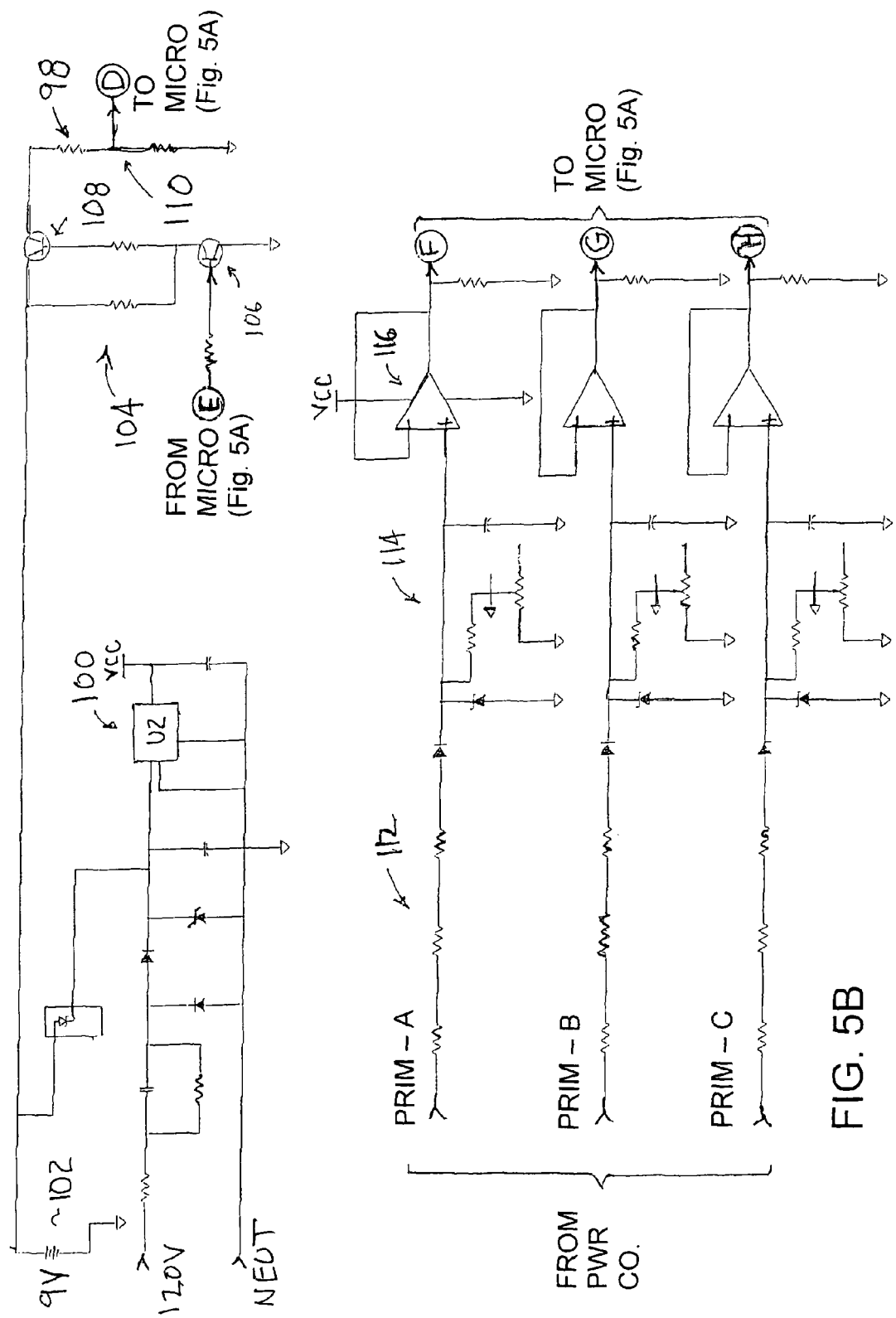
Figure 5C:
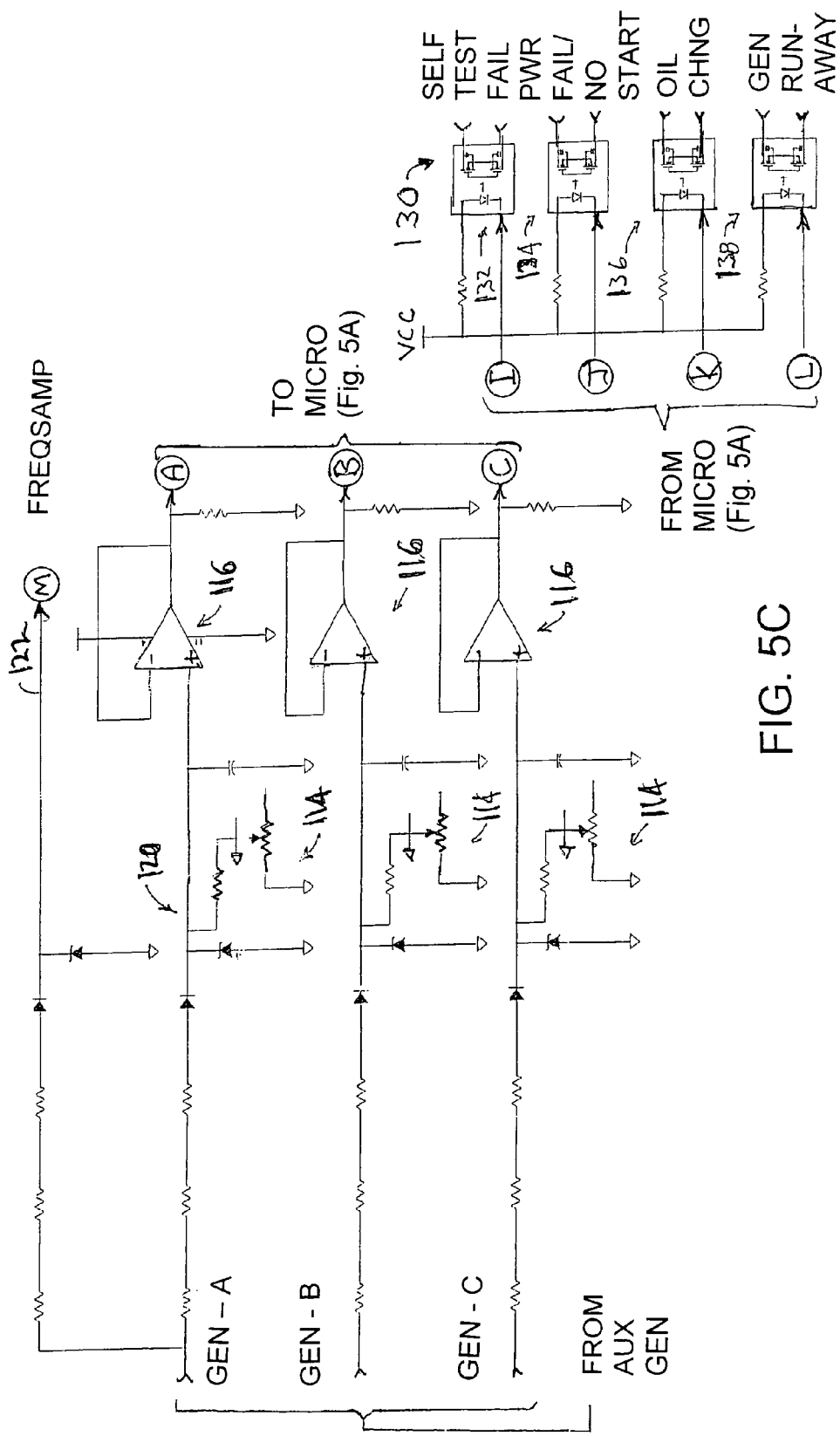

A schematic circuit diagram of the device 80 is shown in FIGS. 5A through 5C where components that are similar to components shown in FIG. 2 have the same numerical identifiers. The circuit includes a microprocessor 90 that controls the operation of the device 80 and includes a timer function. The time base for the timer function is again provided by the crystal 28. As shown in FIG. 5A, the four pushbuttons 18, 84, 86 and 88 are connected between corresponding microprocessor ports and ground. A five pin connector 92 is connected to the microprocessor 90 to provide for in-circuit programming or re-programming of the microprocessor. As in the circuit shown in FIG. 2, the microprocessor 90 has an output port connected to an electronic switch 42 that is operable to activate the annunciator 40 for generating an audible alarm. The microprocessor 90 also has a plurality of output ports connected to the LCD display panel 82. An external clock signal generator 94 provides timing signals to both the LCD display panel 82 and the microprocessor 90. A potentiometer 96 is connected between a power supply output voltage $V_{cc}$ and ground and has a wiper terminal connected to the LCD display panel 82 provides means for adjusting the contrast of the displayed characters.

As shown in FIG. 5B, the device 80 also includes a power supply, shown generally at 98. As in the circuit shown in FIG. 2, the power supply 98 utilizes a "transformerless" design which reduces a 120 volt supply to about five volts DC output voltage, labeled $V_{cc}$ in FIGS. 5A through 5C, without use of a transformer. However, the invention also may be practiced with a step down transformer (not shown) included in the power supply 44. The power supply 98 includes a conventional voltage regulator 100 at its output. The power supply 98 also includes a nine volt backup battery 102 to provide power to the device 80 between an interruption of service from the local power company and the start up of the auxiliary generator. The power supply 98 further includes a battery check circuit 104 having a first electronic switch 106 that is connected to a battery test output port on the microprocessor 90. Activation of the first electronic switch 106 causes a second electronic switch 108 to change to its conducting state whereby the battery 102 is connected across a voltage divider 110. The center tap of the voltage divider 110 is connected to a battery test input port on the microprocessor 90. The invention contemplates that the microprocessor periodically turns on the battery check circuit 104 to sense the battery voltage. If the sensed battery voltage is below a stored threshold, the microprocessor 90 causes a warning message for battery replacement to be displayed upon the LCD display panel 82.

Also shown on FIG. 5B are three power company input circuits 112 that are included in the device 80. Each of the input circuits 112 is connected between a corresponding phase of the input power lines and a corresponding power line input port on the microprocessor 90. The portion of each phase input circuit that is to the left of FIG. 5B is similar to the input circuits shown in FIG. 2. However, each of the phase input circuits 112 includes a trimming circuit 114 for adjusting for variations between circuit component values. Also included in each phase input circuit 112 is an operational amplifier 116 to provide an impedance buffer with the corresponding microprocessor input port. The device 80 is intended for use with utility inputs within a range of 120 to 480 volts. As will be explained below, the device 80 is programmed by means of the pushbuttons for maximum and minimum power supply phase voltages. While three input circuits 112 are shown in FIG. 5B, the number used will depend upon the number of phases available at the location. Thus, if only two wire phase power is supplied, only one input circuit 112 will be connected. Similarly, two input circuits are connected for three wire single and certain three phase power while all of the input circuits are connected for most three phase power. The number of input phases is provided to the microprocessor 90 by means of the pushbuttons.

As shown in FIG. 5C, the device 80 also includes three auxiliary generator monitoring circuits 120. Each of the auxiliary generator monitoring circuits 120 is connected between a corresponding phase of the auxiliary generator and a corresponding auxiliary generator input port on the microprocessor 90. Similar to the phase input circuits 112, each of the auxiliary generator monitoring circuits 120 includes a trimming circuit 114 for adjusting for variations between circuit component values. Also included in each input circuit 120 is an operational amplifier 116 to provide an impedance buffer with the corresponding microprocessor input port. As will be explained below, the device 80 is programmed by means of the pushbuttons for maximum and minimum the auxiliary generator phase voltages and the number of active phases. One of the auxiliary generator phases is also monitored for frequency with a line 122 connecting the phase to a frequency monitoring port on the microprocessor 90. The microprocessor 90 is operable to compare the auxiliary generator phase frequency to a narrow band of acceptable frequencies that are stored within the microprocessor. If the auxiliary generator frequency is outside of the acceptable range, an alarm is activated.

While three auxiliary generator monitoring circuits 120 are shown in FIG. 5C, the number used will depend upon the number of output phases available on the auxiliary generator. Thus, if a two wire single phase output auxiliary generator is used, only one generator monitoring circuit 120 will be connected. Similarly, two generator monitoring circuits are connected for a three wire single phase auxiliary generator and certain three phase auxiliary generators while all three of the generator monitoring circuits would be connected for most three phase auxiliary generators.

As further shown in FIG. 5C, the device 80 also includes four "relays" that provide an interface between the device and an external location. A first relay 130 is connected between the power supply output $V_{cc}$ and a self test failure output port on the microprocessor. The first relay 130 includes an optical relay 132 to assure that the device 80 is electrically isolated from the external location. Upon the microprocessor detecting that a routine periodic self test of the auxiliary generator has not occurred, the self test output port of the microprocessor is pulled to ground, causing a current to flow through the optical relay 132 input terminals. As described below, the optical relay 132 may be programmed as either "Normally Open" or "Normally Closed". If the relay 132 is programmed as "Normally Open", the relay contacts close upon current flowing through the optical relay input terminals. If the relay 132 is programmed as "Normally Closed", the relay contacts open upon current flowing through the optical relay input terminals. The invention contemplates that the first relay output terminals may be connected to a landline that leads to an external location, such as, for example, a monitoring center, as will be described below. Alternately, the output terminals of the optical relay 132 may be connected to a wireless device that sends a message to the external location.

The remaining relays have an identical circuit to the first relay 130, but are connected to different output ports of the microprocessor 90. Thus, a second relay 134 is connected to a no generator start output port on the microprocessor and is operative to activate its relay contacts upon the microprocessor detecting that the auxiliary generator has failed to start in response to a start command. A third relay 136 is connected to an oil change output port on the microprocessor and is operative to activate its relay contacts upon the microprocessor detecting that the auxiliary generator is due for an oil change.

A fourth relay 138 is connected to a generator runaway output port on the microprocessor and is operative to activate its relay contacts upon the microprocessor detecting that the auxiliary generator has remained on for a predetermined time period after the primary power supply has been restored. While four relays are shown in FIG. 5C, it will be appreciated that the invention also may be practiced with more or less relays than shown in the figure.

As described above, the device 80 includes a LCD display screen 82 that is connected to the microprocessor 90. The LCD screen 82 may display "Entry Screens" that are used in conjunction with the pushbuttons 18, 84, 86 and 88 to initially program the device 80. Also, as described below, the LCD screen 82 will display messages, including alarms, regarding the operation of the auxiliary generator. The operation of the device 80 and displayed messages will now be described. Generally, to navigate between LCD screens, the user presses the PREV, where PREV stands for PREVious, or the NEXT button. If the user is on a "USER ENTRY" screen, a blinking underline cursor will appear below the number to be changed. The user then presses the CHANGE button and the value will cycle between valid values. If there are multiple values to enter the user moves to the next value by pressing the NEXT/PREV button.

With regard to USER ENTRY SCREENS, the screens available include the following:

CURRENT DATE—Allows user to enter current date.

CURRENT TIME—Allows user to enter current time in 24-Hour mode, e.g. 3:25 PM is entered as 15:25. After updating the date and time always press the RESET button.

HIGH AND LOW VOLTAGE LIMITS—High and Low valid auxiliary generator voltages as measured to neutral. Valid values are 000V to 599V. This sets the expected voltages for BOTH the generator and the utility power. Because the device 80 does not have high voltage accuracy, the LO and HI limits should be set to be about 20% beyond the nominal voltages. E.g. for a 120V system set the low limit to be 120V*0.8=95V and the high limit to be 120*1.2=145V.

NUMBER OF HOT INPUTS—Number of active inputs when generator and utility power is on. Valid values are 1, 2 or 3.

NUMBER OF DAYS IN EXERCISE CYCLE—Number of days between exercise cycles. The installer must set this to at least one day more than what the number of days for which the generator is programmed. Valid values are 01 to 27 days.

CHECK FOR GENERATOR RUNAWAY—Specifies whether the device 80 should check for the Generator Runaway condition. A "Generator Runaway" means that the generator ran for more than a predetermined time period, such as, for example, 50 minutes, while utility power is on. Essentially, it determines if the generator fails to stop when utility power is present. Valid entries are Y or N. Checking for runaway requires that wires be connected to the prime power (utility side) of a transfer switch, as described below.

SELFTEST ALM RLY NORMALLY OPEN—Allows user to specify Normally Open vs. Normally Closed relay for the Selftest Alarm. The relay will activate if the generator exercise fails. Press the RESET button to clear the alarm condition.

GEN FAIL ALM RLY-NORMALLY OPEN—Allows user to specify Normally Open vs. Normally Closed relay for the Generator Failure'Alarm. This relay will activate if the utility power fails and the generator does not come on within 1 minute. Pressing the RESET button clears the alarm condition.

OIL CHG ALM RLY NORMALLY OPEN—Allows user to specify Normally Open vs. Normally Closed relay for the Oil Change Alarm. This relay will activate if the number of generator run hours exceeds the value entered in the "CHANGE OIL EVERY xx RUN HOURS" screen, or, the number of months since the last oil change exceeded the value entered in the "CHANGE OIL EVERY xx MONTHS" screen. Press the RESET button to clear the alarm condition.

GEN RUNAWAY RLY NORMALLY OPEN—Allows user to specify Normally Open vs. Normally Closed relay for the Generator Runaway Alarm. A "Generator Runaway" means that the generator ran for more than 50 minutes while utility power is on. Essentially, it determines if the generator fails to stop when utility power is present. Press the RESET button to clear the alarm condition.

CHANGE OIL EVERY 100 RUN HOURS—Allows the user to enter the number of run hours between oil changes. Valid values are 001-199 run hours.

CHANGE OIL EVERY 12 MONTHS—Allows the user to enter the number of months between oil changes. Valid values are 1-23 months.

The device also includes a plurality of operational screens that are described in the following:

SIMULATE ALARM? (HOLD CHANGE)—Holding the CHANGE button for 2 seconds will cause the system to go into the alarm state. The four alarm relays 130, 134, 136 and 138 will be activated. This is useful to test all four alarm relays simultaneously during installation of the device.

CLEAR GEN INFO? (HOLD CHANGE)—Holding the CHANGE button for 2 seconds clears the NUM GOOD RUNS and NUM BAD RUNS counters.

RST OIL CHANGE? (HOLD CHANGE)—Holding the CHANGE button for 2 seconds to tells the device 80 that the oil had been changed. This must be done each time the oil is changed. When this screen is used the device 80 schedules an oil change by reading the current time and date and adding the number of months as specified on the "CHANGE OIL EVERY XX MONTHS" screen. Additionally the device reads the TOTAL RUN TIME and adds the number of run hours as specified on the "CHANGE OIL EVERY XXX RUN HOURS" screen.

UTILITY VOLTMETER A120 B120 C122 —Displays the voltages of utility A/B/C leads. These will normally show all 0's because the generator is off. Note that if there is only one hot input, then only the A reading will be valid and the B and C readings will show as B000 and C000. The accuracy of this voltmeter is about 5% and is considered normal if the voltage does not agree exactly with an external voltmeter.

GEN VOLTMETER A120 B120 C122—Voltage of auxiliary generator A/B/C leads. These will normally show all zeros when the auxiliary generator is off Note that if there is only one hot input, then only the A reading will be valid and the B and C readings will show as B000 and C000. The accuracy of this voltmeter is about 5% and it is normal if it does not agree exactly with an external voltmeter.

GEN FREQUENCY 60 HZ—Frequency of generator Input A lead. The frequency will show—Hz when the generator is off NUM GOOD RUNS 0002—Number of good exercise cycles, plus the number of times the generator has turned on. This counter can be reset to zero using the "CLEAR GEN INFO" screen.

NUM BAD RUNS 0003—Number of bad exercise cycles plus the number of "start failures". This value will increment each time the generator fails to exercise or each time the utility power fails and the generator does not come on. This counter can be reset to zero using the "CLEAR GEN INFO" screen.

LAST GOOD RUN Nov. 22, 2005 17:43—Date and time of last exercise cycle, or, date and time the last time the generator turned on. The time is shown as 24 hour mode. E.g. 5:15 PM is shown as 17:15.

LAST RUN DURATION 000 HR 00 MIN—Duration of last good exercise cycle, or, duration the last time the generator turned on.

TOTAL RUN TIME 00000 HR 00 MIN—Total number of run-time-hours. The run time hour meter can be reset to 0 by holding the CHANGE button for 8 seconds while on this screen. This is useful if the user wants to move the device 80 to a different auxiliary generator.

NEXT RUN BEFORE 07 DAYS 23 HRS—Countdown until next exercise cycle. The device 80 will alarm and declare an exercise failure if the generator does not come on before the countdown expires.

LAST RESET Nov. 18, 2005 03:42—Date and time of the last time the RESET button was pressed. The time is shown as 24 hour mode, e.g. 5:15 PM is shown as 17:15.

The device 80 further includes a plurality of alarm, or event, screens that are displayed automatically upon occurrence of the alarm or event. The screens are described in the following:

GENERATOR IS ON—This screen will flash and the annunciator 40 will chirp every 5 seconds when the auxiliary generator is outputting voltage which lies within the values entered on the VOLTAGE LIMITS screen. Note that the NUM HOT INPUTS screen must also be set appropriately for the device 80 to determine that the generator is on.

WARNING EXERCISE FAILURE alternating with PRESS RESET TO CLEAR ALARM

This screen is shown every 10 seconds if an exercise cycle fails to start. That is, if the generator failed to start prior to the time specified on the EXERCISE CYCLE NUM DAYS screen. The display will cycle between the two screens shown every 2 seconds until the RESET button is pressed.

WARNING GEN START FAIL alternating with PRESS RESET TO CLEAR ALARM

This screen is shown if the power fails and the generator does not start within 1 minute. The display will cycle between the two screens shown every 2 seconds until the RESET button is pressed.

GENERATOR RUNAWAY alternating with PRESS RESET TO CLEAR ALARM

This screen appears should the generator run for a predetermined time period; such as, for example, 50 minutes, while utility power is present, that is, the generator is on and did not shut off when the utility power came back on. The display will cycle between the two screens shown every 2 seconds until the RESET button is pressed. This screen will only appear if "Y" is selected on the CHECK FOR GEN RUNAWAY screen.

TIME FOR OIL CHANGE—This screen appears after the "CHANGE OIL EVERY xx RUN HOURS" or after the "CHANGE OIL EVERY xx MONTHS" values, whichever occurs first. The user MUST activate the "RST OIL CHANGE?" screen to get rid of this message. The annunciator 40 will "chirp" if an oil change is needed.

WARNING REPLACE BATTERY—This screen is shown when the internal backup battery 102 gets low. The annunciator 40 will "chirp" every 5 seconds during the low battery condition. The system checks for the low battery condition every 10 minutes. After the user replaces the battery the device 80 may continue to chirp and display the low battery warning for up to 10 minutes. Should this occur, the user simply presses the RESET button to tell the device 80 that the battery 102 has been replaced.

PLEASE ENTER DATE AND TIME—This screen is shown when the date is invalid (when the year field is 00). This screen will flash every 5 seconds until the year is made to be something other than 00. The usual cause for this screen is that the utility power went off when the battery was also dead, thus the device 80 had no power (not even battery backup power). The user must enter the correct date and then switch to the CURRENT TIME screen and assure that the time has been correctly set.

It will be appreciated that the above screens are meant to be exemplary and that the invention also may be practiced with utilization of other screens than those listed above displayed upon may also be utilized upon the LCD display screen 82.

Figure 6A:
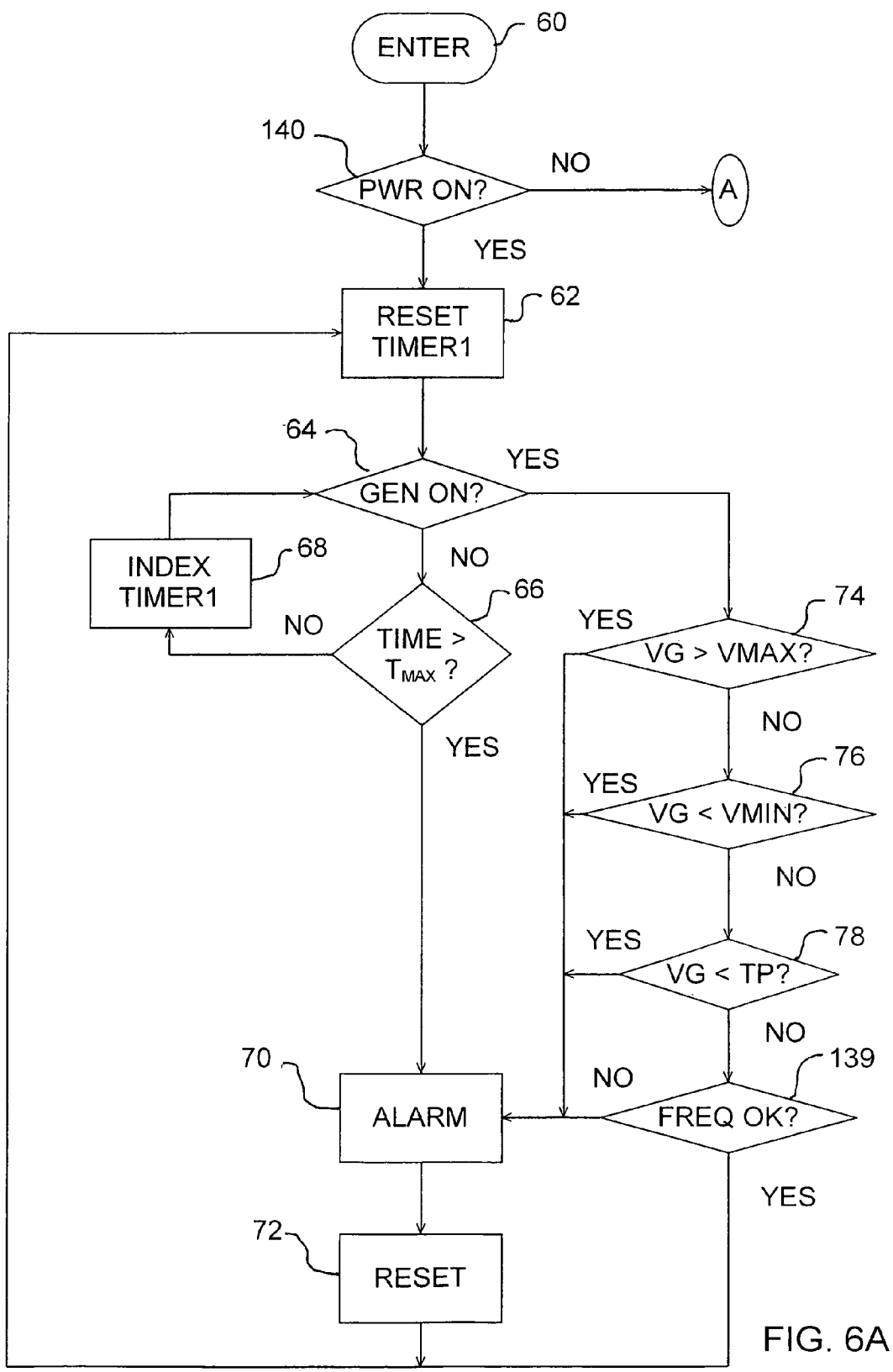
FIG. 6 is a flow chart illustrating the operation of the device shown in FIG. 4.
Figure 6B:
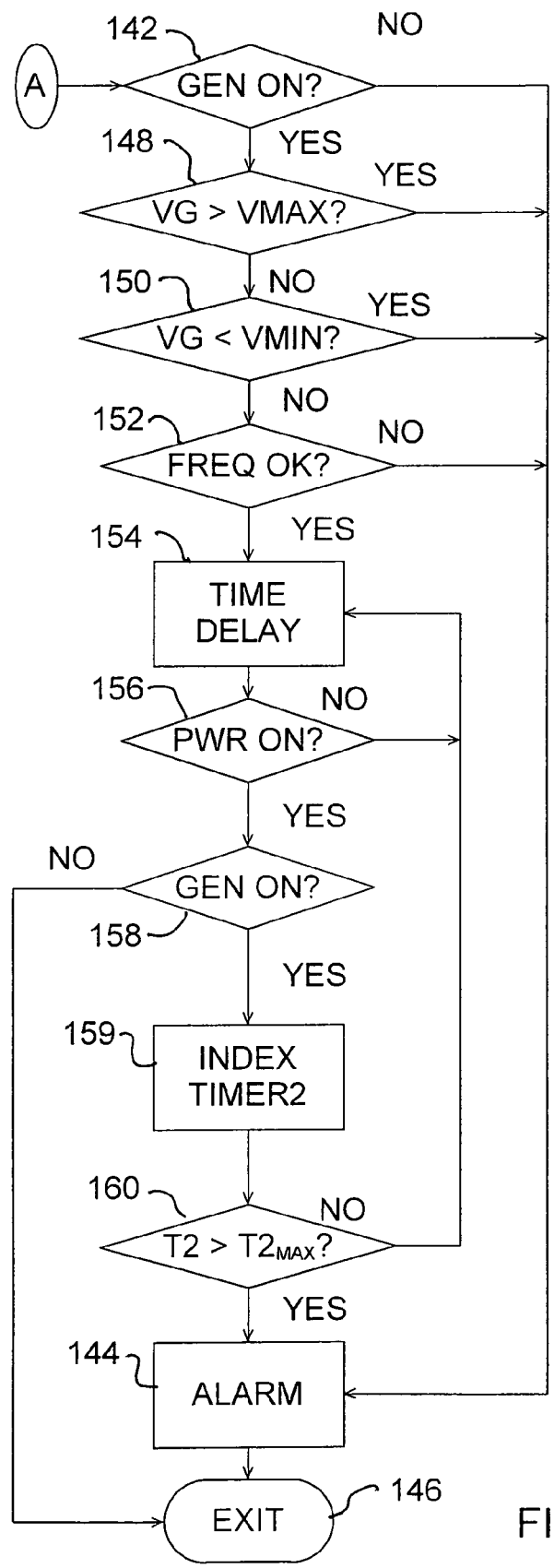

A flow chart for the method of operation of the device 80 is shown in FIG. 6, where blocks that are similar to the blocks shown in FIG. 3 have the same numerical identifiers. The method of operation is stored either within the microprocessor 90 or in a separate memory component (not shown) that is connected to the microprocessor. As described above, the connector 92 is utilized to program or reprogram the method.

The method of operation is entered through block 60 and advances to decision block 140 where the microprocessor 90 checks the utility power supply leads to determine whether power is available. If power is available, the method transfers to functional block 62 and proceeds with routine testing of the auxiliary generator as described above and illustrated by the flowchart shown in FIG. 3, except for the addition of decision block 139 in FIG. 6. In decision block 139, the frequency of one of the auxiliary generator phases is checked. If the phase frequency is not correct, an alarm signal is activated.

If no power is available from the utility in decision block 140, the auxiliary generator should have started within a predetermined time period. Accordingly, if no utility power is available, the method transfers to decision block 142, where the microprocessor determines whether the auxiliary generator failed to start within one minute of the utility power failure. If this is the case, the method transfers to functional block 144 where the WARNING GEN START FAIL message is displayed upon the LCD screen 82. Also, the NO GEN START relay 134 is activated to provide a warning at a remote location, if the device 80 is so equipped. The flow chart then exits through block 146.

If it is determined in decision block 142 that the auxiliary generator is operating, the method transfers to decision block 148 for of a series of tests that are similar to the ones shown in FIG. 3. In decision block 148, the output voltage of each phase of the auxiliary generator is compared to a maximum voltage limit. If the maximum voltage limit is exceeded, the method again transfers to functional block 144 where a corresponding alarm is activated and the method then exits through block 146. If the maximum voltage limit is not exceeded in decision block 142, the method transfers to decision block 150, where the output voltage of each phase of the auxiliary generator is compared to a minimum voltage limit. If any phase voltage is less than the minimum voltage limit, the method again transfers to functional block 144 where a corresponding alarm is activated and the method then exits through block 146. If all of the phase voltages are greater than or equal to the minimum voltage limit, the method transfers to decision block 152 where the frequency of one of the auxiliary generator phases is checked. If the frequency is not correct, the method chart transfers to functional block 144 where an alarm signal is activated and the method then exits through block 146. If the phase frequency is determined to be correct, the method transfers to functional block 154.

In functional block 154, a time delay that may be one iteration or a multiple number of iterations of the microprocessor is implemented. The method then advances to decision block 156. In decision block 156, the microprocessor 90 checks to determine whether the utility power has been restored. If the utility power has not been restored, the method transfers back to functional block 154, where another time delay is implemented, and the method continues on to decision block 156. If, in decision block 156, the utility power has been restored, the flowchart transfers to decision block 158 where the microprocessor 90 checks to determine whether or not the auxiliary generator is still on. If the auxiliary generator has shut down, the system is operating properly and the method transfers to the exit block 146. However, if, in decision block 158 it is determined that the auxiliary generator is still on even though the utility power has been restored, the method transfers to functional block 159 where a second timer is indexed. The method then continues to decision block 160.

In decision block 160, the microprocessor 90 compares the total time accumulated on the second timer to a predetermined time period, such as, for exampled, 50 minutes. If the predetermined time period is exceeded, the method transfers to functional block 144 where the WARNING GENERATOR RUNAWAY message is displayed upon the LCD screen 82. Also, the GENERATOR RUNAWAY relay 138 is activated to provide a warning at a remote location, if the device 80 is so equipped. The method then exits through block 146. If, in decision block 160 the predetermined time period is not exceeded, the method transfers to functional block 154 for another time delay and the method proceeds as described above.

It will be appreciated that the flowchart shown in FIG. 6 is intended to be exemplary and that the invention also may be practiced in a manner other than shown in the figure.

Figure 7:
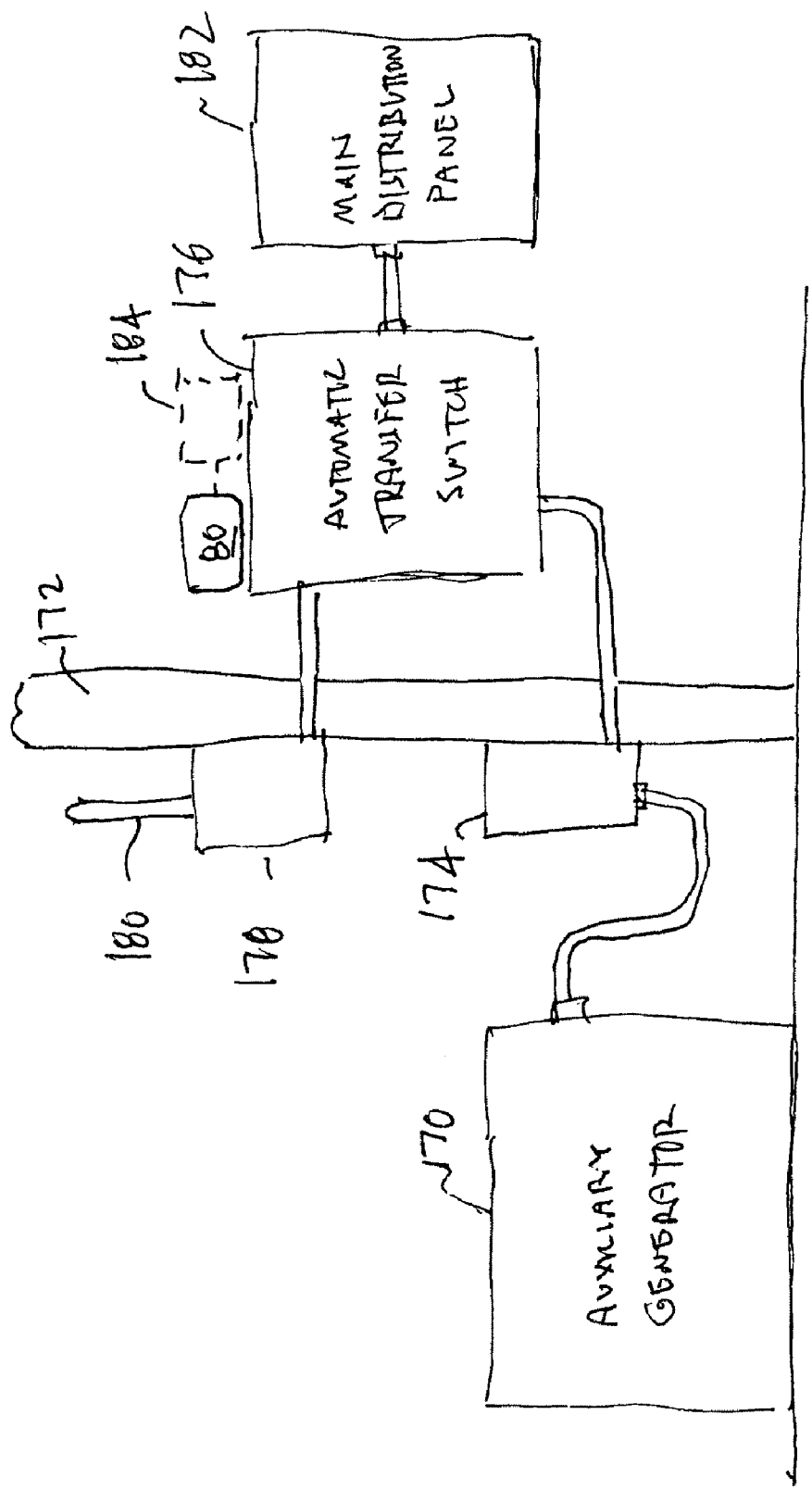
FIG. 7 is a block diagram illustrating a typical installation of the device shown in FIG. 4.

A block diagram of a typical installation of the device 80 is shown in FIG. 7 where an auxiliary generator 170 is located outside a building exterior wall 172. The auxiliary generator 170 is connected through an external connection box 174 to a first set of input terminals of an automatic transfer switch 176. The automatic transfer switch 176 also has a second set of input terminals that are connected through a utility power meter 178 to a utility power drop 180. The automatic transfer switch 176 also has output terminals connected to a main distribution panel 182 for the building. The automatic transfer switch 176 is operable, upon a failure of the utility power supply, to switch the supply of power from the utility to the auxiliary generator, which is then started to supply power to the building. Additionally, the automatic transfer switch 176 is operable, upon restoration of the utility power supply, to switch the supply of power back to the utility and to shut down the auxiliary generator. Also shown in FIG. 7, is an interface device 184. The interface device is optional and so is shown in phantom in FIG. 7. When present, the interface device 184 is connected to the alarm relays 130, 134, 136 and 138 of the device 80. The invention contemplates that the interface device 184 is hard wired though telephone lines (not shown) to a remote location (not shown) where the operation of the auxiliary generator is monitored. The remote locate would, upon receiving an alarm, alert the owner of the building and/or dispatch personnel to the building to investigate and correct any conditions that led to activation of the alarm. Alternately, the interface device 184 may utilize wireless technology to communicate with the remote location. Such wireless communication may be via telephone, cellular telephone, internet or any other commercially available wireless connection. While the installation has been illustrated and described for the device 80, it will be appreciated that the device 10 shown in FIGS. 1 and 2 also may be utilized in FIG. 7.

In accordance with the provisions of the patent statutes, the principle and mode of operation of this invention have been explained and illustrated in its preferred embodiment. However, it must be understood that this invention may be practiced otherwise than as specifically explained and illustrated without departing from its spirit or scope. For example, the generator start validation conditions may be eliminated, additional validation conditions included, or entirely different validation conditions may be utilized. Additionally, while the invention has been described and illustrated as utilizing a microprocessor, it will be appreciated that the invention also may be practiced with another device, such as, for example, an Application Specific Integrated Circuit (ASIC) or other similar devices.

What is claimed is:

1. A device for verifying the self-testing function of an auxiliary electric generator comprising:
   a microprocessor adapted to be connected to an output of the auxiliary generator;
   a plurality of switches connected to said microprocessor; said switches being operable to set operating parameters related to the auxiliary generator within said microprocessor;
   a display screen connected to said microprocessor that is operative to display status indicators related to the auxiliary generator; and
   an alarm device connected to said microprocessor, said microprocessor being operative to activate said alarm device upon a predetermined time period passing without detection of an output voltage being generated by the auxiliary generator.

2. The device according to claim 1 wherein said microprocessor is also operative to reset the duration of said time period upon detection of an output voltage being generated by the auxiliary generator.

3. The device according to claim 2 wherein said microprocessor also is operable to detect a failure of the auxiliary generator to meet at least one of said operating parameters while the generator is generating an output voltage.

4. The device according to claim 3 wherein said alarm device generates an audio signal.

5. The device according to claim 3 further including a plurality of relays connected to said microprocessor, said relays adapted to be connected to an external interface, said microprocessor being operable to selectively energize said relays upon detection of a failure of the auxiliary electric generator meet at least one of said operating parameters whereby said external interface is actuated.

6. The device according to claim 5 wherein said interface is connected to a telephone line and is operable to alert a remote location upon actuation of at least one of said relays.

7. The device according to claim 5 wherein said interface is connected to a wireless communication device that is operable to alert a remote location upon actuation of at least one of said relays.

8. The device according to claim 7 wherein said a display screen includes a liquid crystal array.

9. The device according to claim 5 further including a power supply that includes a backup battery, said backup battery being sufficient to provide power to said device during a power outage and prior to start-up of the auxiliary generator.

10. The device according to claim 9 wherein said switches are pushbuttons.

11. The device according to claim 3 wherein said operating parameter is the auxiliary generator output voltage and further wherein said microprocessor is operable to actuate said alarm during a generator self-test upon determining that the output voltage exceeds a predetermined maximum output voltage.

12. The device according to claim 3 wherein said operating parameter is the auxiliary generator output voltage and further wherein said microprocessor is operable to actuate said alarm during a generator self-test upon determining that the output voltage is less than a predetermined minimum output voltage.

13. The device according to claim 3 wherein said operating parameter is the auxiliary generator operating time duration and further wherein said microprocessor is operable to actuate said alarm during a generator self-test upon determining that the generator operating time duration is less than a predetermined time period.

14. The device according to claim 3 wherein said operating parameter is the auxiliary generator output frequency and further wherein said microprocessor is operable to actuate said alarm during a generator self-test upon determining that the generator output frequency is outside of a range of frequencies.

15. A method for verifying a self-test function of an auxiliary generator comprising the steps of:
   (a) providing a microprocessor that is connected to an alarm device, the microprocessor being adapted to be connected to an output of the auxiliary generator;
   (b) monitoring the generator output with the microprocessor; and
   (c) actuating the alarm device upon a predetermined time period passing without an output voltage being generated by the generator.

16. The method of claim 15 wherein the microprocessor also is connected to a plurality of relays and step (c) also includes actuating selected relays whereby a remote facility is alerted to the failure of the generator self-test.

17. The method of claim 16 wherein step (b) also includes monitoring at least one operating parameter of the auxiliary generator and step (c) includes actuating the alarm during a generator self-test upon the operating parameter failing to meet a predetermined threshold.

18. The method of claim 17 wherein the generator operating parameter monitored in step (b) is the generator output voltage level and the alarm is actuated in step (c) when the output voltage level is outside of a predetermined operating voltage range.

19. The method of claim 18 further including in step (c) resetting the duration of the time period upon detection of an output voltage from the auxiliary generator, reset the duration of said time period upon detection of an output voltage being generated by the auxiliary generator

* * * * *